United States Patent
Belanger, Jr.

[11] Patent Number: 5,258,889
[45] Date of Patent: Nov. 2, 1993

[54] APPARATUS FOR COMPLIANTLY RETAINING A CIRCUIT BOARD IN A HOUSING

[75] Inventor: Thomas D. Belanger, Jr., Saline, Mich.

[73] Assignee: Ford Motor Company, Dearborn, Mich.

[21] Appl. No.: 952,101

[22] Filed: Sep. 28, 1992

[51] Int. Cl.$^5$ .............................................. H05K 1/14
[52] U.S. Cl. ........................ 361/740; 211/41; 174/250; 248/220.2; 361/759
[58] Field of Search .............. 361/380, 391, 392, 394, 361/395, 397, 398, 399, 400, 412, 415; 174/250, 255; 257/678; 211/41; 248/674, 678, 220.2, 200, 221.3, 227

[56] References Cited

U.S. PATENT DOCUMENTS

| | | |
|---|---|---|
| 2,663,104 | 12/1953 | Hoagland . |
| 3,952,906 | 4/1976 | Georgopulos . |
| 4,268,100 | 5/1981 | Kekas et al. . |
| 4,388,672 | 6/1983 | Skill . |
| 4,407,416 | 10/1983 | Anderson . |
| 4,452,359 | 6/1984 | Koppensteiner . |
| 4,486,816 | 12/1984 | Hope . |
| 4,890,198 | 12/1989 | Beam et al. ......................... 361/399 |
| 4,901,205 | 2/1990 | Landis et al. . |
| 4,991,666 | 2/1991 | Septfons et al. ..................... 174/261 |
| 5,019,948 | 5/1991 | Steketee et al. . |
| 5,148,962 | 9/1992 | Jones et al. ......................... 228/49.1 |

Primary Examiner—Leo P. Picard
Assistant Examiner—Young Whang
Attorney, Agent, or Firm—Mark L. Mollon; Roger L. May

[57] ABSTRACT

An apparatus compliantly retains a circuit board including a housing comprising two portions. Within the housing is a seat for supporting the printed circuit board. When the two housing portions are brought together a snap retainer engages. A flexible tang urges the circuit board between it and the seat holding the circuit board in place.

5 Claims, 1 Drawing Sheet

APPARATUS FOR COMPLIANTLY RETAINING A CIRCUIT BOARD IN A HOUSING

BACKGROUND OF THE INVENTION

The present invention relates geneartly to printed circuit board assemblies and more particularly to means for securing a printed circuit board within a housing.

Numerous methods are avaliable to secure printed ciruit (PC) boards in a housing. Such methods include the use of screws or rivets which are labor intensive, as well as expensive.

Another method currently used inlcudes a cover which snaps onto a housing. The PC board is sandwiched into a fixed space provided between the cover and the housing. However, a problem arises because the manufacturing process for printed circuit boards leads to some variability in the board thickness. Because of the inflexibility of the cover and the housing, the outer cover has a tendency to crack if the PC board is too thick. Conversely, if the PC board is too thin it vibrates in the housing, causing noise and durability problems.

SUMMARY OF THE INVENTION

It is therefore a primary object of the present invention to provide a flexible PC board housing to secure the PC board in a fixed position in such a manner as to compensate for the variability in PC board thicknesses.

Briefly, a preferred embodiment of the present invention includes a housing having a first and second portion. The first housing portion has a flexible tabular portion. The second housing portion has a seat for supporting a printed circuit board. The first housing portion is engaged with the second housing portion in a fixed relationship such that when the first housing portion is secured to the second housing portion, the flexible tabular portion urges the printed circuit board against the housing seat with a sufficient force to hold the printed circuit board in a fixed relationship within the housing.

An important advantage of the present invention is that it provides a flexible PC board retaining mechanism resulting in fewer unit repairs resulting in less cost.

These and other objects and advantages of the present invention will become apparent to those skilled in the art after having read the following detailed description of the preferred embodiment which are contained in and illustrated by the various drawing figures.

DETAILED DESCRIPTION OF THE INVENTION

Figure 1:
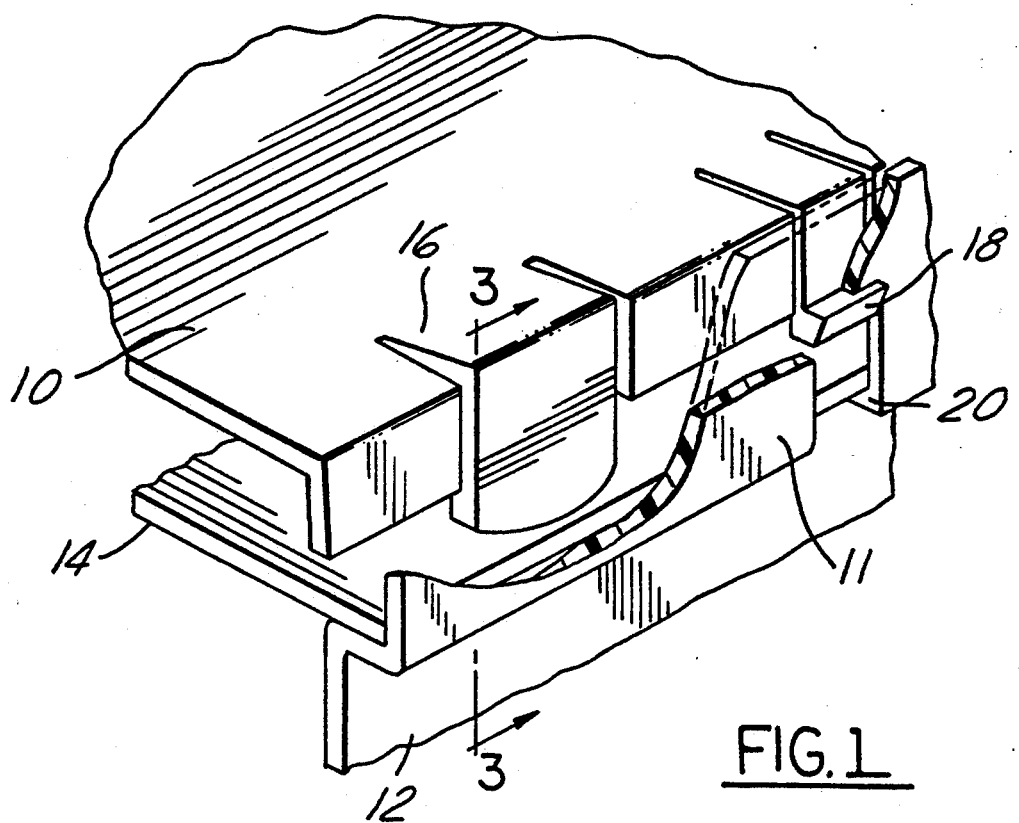
FIG. 1 is an isometric view of the preferred embodiment.

Referring now to FIG. 1, a preferred embodiment of the present invention is shown enclosing a circuit board.

A housing for the circuit board comprises two pieces, a housing 12 and a housing cover 10 which are preferably made of a thermoplastic. Cover 10 has an L-tab 16 and snap tang 18 which can be made of a plastic material. L-tab 16 can be either recessed into cover 10 as shown or can extend beyond the outer edge of cover 10. A preferred relationship between L-tab 16 and cover 10 is to have one leg of L-tab 16 flush with the surface of cover 10 and the other leg of L-tab 16 perpendicular to the surface of cover 10. L-tab 16 should be recessed into cover 10 such that no part of either leg protrudes past the perimeter of cover 10. L-tab can be molded into cover 10 or can be cut into cover 10 after the molding process. Typically one or two L-tabs are provided per printed circuit board edge depending on size. For example, one housing has been made using six L-tabs for a 90 mm. by 110 mm. circuit board, two on each edge excluding one 110 mm. edge so as not to interfere with a connector incorporated on the circuit board. Snap tang 18 extends from the cover 10 in a parallel direction to the surface of cover 10 and is shaped so that it will secure housing 12 to cover 10 at snap opening 20. Snap tang 18 may be formed to be compliant in the same manner as L-tab 16 is formed.

Housing 12 has snap opening 20 and housing seat 22 which may be integrated thereinto. Seat 22 is a protrusion or formed surface on the interior of housing 12 to provide support printed circuit board 14. Snap opening 20 is formed in wall 11 of the housing 12 to accept snap tang 18 when cover 10 is placed on housing 12. Cover 10 is fixedly attached to housing 12 when snap tang 18 engages snap opening 20. Once cover 10 is placed onto housing 12 and snap tang 18 engages snap opening 20, L-tab 16 flexes so as to compliantly retain printed circuit board 14 between seat 22 and L-tab 16. Snap tang 18 may also flex to help compensate in variations in thickness of printed circuit board 14.

During the assembly process, printed circuit board 14 is first inserted into housing 12. Cover 10 is then placed over housing 12 and pressed toward housing 12 so that snap tang 18 engages snap opening 20. L-tab 16 applies adequate force to hold printed circuit board 14 against housing seat 22 without vibration. L-tab 16 is made to flex as the thickness of printed circuit board 14 varies without causing the cover to stress or fracture. Snap tang 18 may also flex to help compensate in variations in thickness of printed circuit board 14.

Figure 2:
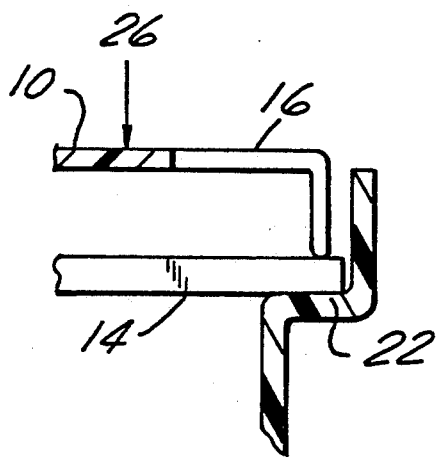
FIG. 2 is a cross section of the present invention before the cover is snapped into place.

FIG. 2 shows a cross section of the interface prior to final assembly between cover 10, housing 12 and printed circuit board 14 and undeformed L-tab 16. L-tab 16 in its undeformed state is preferably flush with the surface of cover 10. A force in direction of 26 is applied to cover 10 until snap 18 engages snap opening 20.

Figure 3:
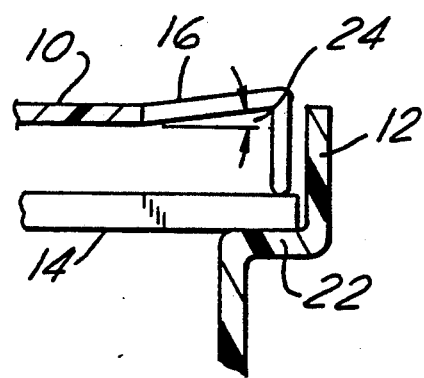
FIG. 3 is a cross section of the present invention with the cover snapped into place.

FIG. 3 shows a cross section of the interface after final assembly between cover 10, housing 12, printed circuit board 14, and deformed L-tab 16. When cover 10 is snapped into place on housing 12, L-tab 16 is flexed by a small angle 24. Angle 24 varies as the thickness of printed circuit board 14 varies. L-tab 16 when flexed will provide sufficient force to hold printed circuit board 14 against housing seat 22 which is shown as an integral part of housing 12. For example, a nominal value for the force exerted by the L-tab 16 on the printed circuit board 14 is about 13.75 pounds.

Although the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An apparatus for retaining a printed circuit board comprising:
   a housing having a first and second portion, said first portion having a flexible tabular portion, said second portion having a seat for supporting the printed circuit board; and
   means for engaging said first housing portion to said second housing portion in a fixed relationship such that when said first housing portion is secured to said second housing portion, the flexible tabular portion urges the printed circuit board against the housing seat with a sufficient force to hold the printed circuit board in a fixed relationship within said housing.

2. The apparatus as in claim 1, having an engaging means for holding said first housing portion in a fixed relationship to said second housing portion comprising a snap tang integrally formed on said first housing portion and a means for receiving said snap tang integrally formed on said second housing portion such that when the first housing portion is placed in said second housing portion, the snap tang engages the means for receiving the snap tang.

3. An apparatus for retaining a printed circuit board comprising:
   a housing having a first and second portion, said first portion having a flexible snap tang, said second portion having a seat for supporting the printed circuit board;
   a means for receiving said flexible snap tang integrally formed on said second housing portion such that when the first housing portion is placed in said second housing portion, the flexible snap tang engages the means for receiving the flexible snap tang, and
   means for holding the printed circuit board in a fixed relationship within said housing when the flexible snap tang holds the first housing portion to the second housing portion.

4. The apparatus as in claim 3, having a holding means for the printed circuit board comprising an L-tab integrally formed on said first housing portion.

5. An apparatus for retaining a printed circuit board comprising:
   a housing having a first and second portion, said first portion having a flexible L-tab and flexible snap tang, said second portion having a seat for supporting the printed circuit board; and
   a means for receiving said flexible snap tang integrally formed on said second housing portion such that when the first housing portion is placed in said second housing portion, the flexible snap tang engages the means for receiving the flexible snap tang and the flexible L-tab portion holds the printed circuit board in a fixed relationship to the seat of the housing.

* * * * *